United States Patent
Arao et al.

(10) Patent No.: US 7,225,366 B2
(45) Date of Patent: May 29, 2007

(54) TRANSPORT SYSTEMS AND METHOD OF MONITORING BURST ERROR

(75) Inventors: Hideaki Arao, Kawasaki (JP); Masahiro Shioda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 461 days.

(21) Appl. No.: 10/769,133

(22) Filed: Jan. 30, 2004

(65) Prior Publication Data
US 2004/0205444 A1    Oct. 14, 2004

(30) Foreign Application Priority Data
Mar. 13, 2003 (JP) .............................. 2003-068980

(51) Int. Cl.
*G06F 11/00*    (2006.01)
(52) U.S. Cl. ........................................ 714/47; 714/799
(58) Field of Classification Search .................. 714/47, 714/52, 57, 799
See application file for complete search history.

(56) References Cited

U.S. PATENT DOCUMENTS

| | | | | |
|---|---|---|---|---|
| 4,800,562 A | * | 1/1989 | Hicks | 714/704 |
| 6,487,686 B1 | * | 11/2002 | Yamazaki et al. | 714/703 |
| 7,028,231 B1 | * | 4/2006 | Tezuka | 714/704 |
| 7,092,435 B2 | * | 8/2006 | Saruwatari | 375/227 |

FOREIGN PATENT DOCUMENTS

JP    52-009335    1/1977

\* cited by examiner

*Primary Examiner*—Nadeem Iqbal
(74) *Attorney, Agent, or Firm*—Katten Muchin Rosenman LLP

(57) ABSTRACT

A transport systems is equipped with a burst error detecting unit that monitors a predetermined byte, which is specified in advance in a frame to be monitored, in a transmission signal having header information and data information multiplexed into the frame in bytes. The burst error detecting unit detects a burst error based on a change in a state of occurrence of a bit error in the predetermined byte in a predetermined time window.

10 Claims, 13 Drawing Sheets

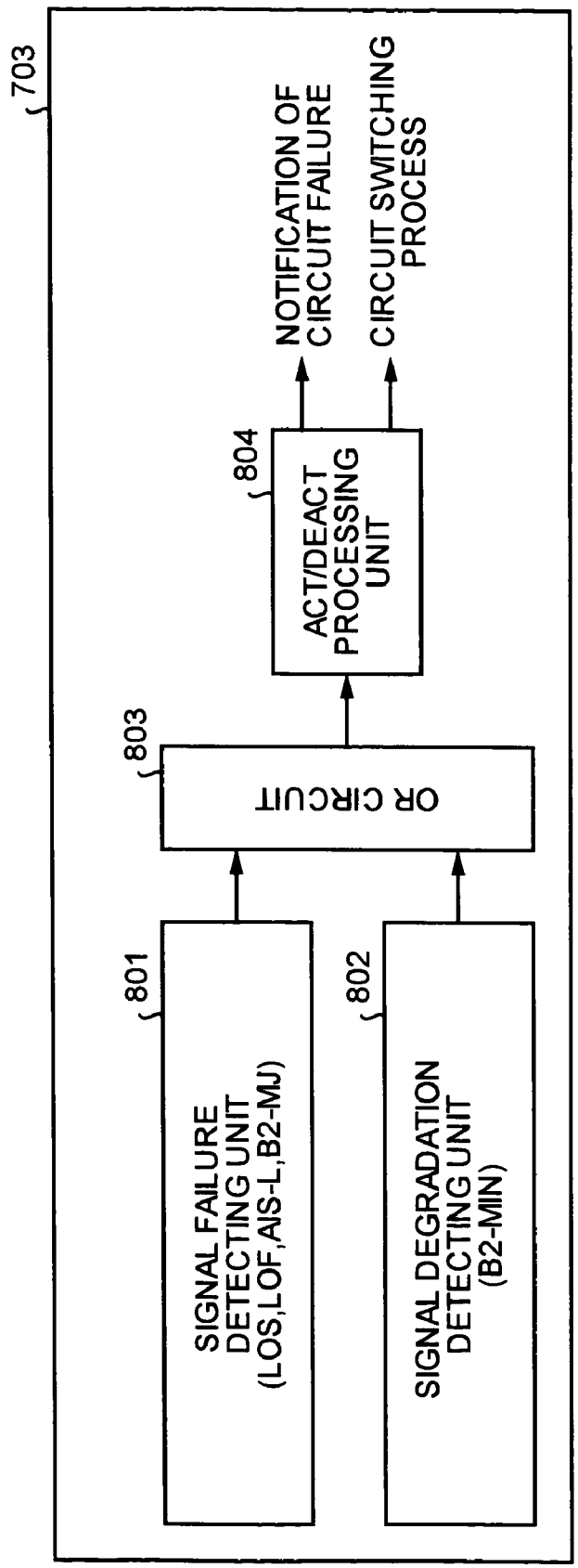

FIG.13

| | DETECTION CIRCUIT STANDARDS | | | | | | | THEORETICAL VALUE |
|---|---|---|---|---|---|---|---|---|
| BIT ERROR RATE | MONITOR FRAME LENGTH | MONITOR TIME (SEC) | NUMBER OF ERRORS | NUMBER OF SUCCESSIONS | DETECTION TIME (SEC) | NUMBER OF DETECTED ERRORS | NUMBER OF DETECTIONS PER SECOND | SIMPLY COMPUTED ERROR RATE | 1 SEC (8000 FRAMES) PM COUNT |
| 1.0E-03 | 1 | 0.00013 | 150 | 58 | 0.00725 | 8700 | 1,200,000 | 4.88E-04 | 2,460,672 |
| 1.0E-04 | 9 | 0.00113 | 204 | 7 | 0.00788 | 1428 | 181,333 | 7.37E-05 | 246,067 |
| 1.0E-05 | 90 | 0.01125 | 204 | 7 | 0.07875 | 1428 | 18,133 | 7.37E-06 | 24,607 |
| 1.0E-06 | 900 | 0.11250 | 204 | 7 | 0.78750 | 1428 | 1,813 | 7.37E-07 | 2,461 |
| 1.0E-07 | 9,000 | 1.12500 | 204 | 7 | 7.87500 | 1428 | 181 | 7.37E-08 | 246 |
| 1.0E-08 | 90,000 | 11.25000 | 204 | 7 | 78.75000 | 1428 | 18 | 7.37E-09 | 25 |
| 1.0E-09 | 900,000 | 112.50000 | 204 | 7 | 787.50000 | 1428 | 2 | 7.37E-10 | 2 |

TRANSPORT SYSTEMS AND METHOD OF MONITORING BURST ERROR

CROSS-REFERENCE TO RELATED APPLICATIONS

This application is based upon and claims the benefit of priority from the prior Japanese Patent Application No. 2003-068980, filed on Mar. 13, 2003, the entire contents of which are incorporated herein by reference.

BACKGROUND OF THE INVENTION

1) Field of the Invention

The present invention relates to a transport systems and a method of monitoring a burst error in a synchronous optical network (SONET), and more particularly, to a transport systems and a method of monitoring a burst error that detects the burst error in a transmission signal having header information and data information multiplexed into a frame in bytes, and that notifies a line failure or executes line switching.

2) Description of the Related Art

A SONET transport systems monitors an error in a transmission signal by monitoring a parity using B2 byte of a line overhead (LOH) included in STS-N (N=1, 3, 12, 48, 192) frame.

FIG. 7 is a block diagram of an interface circuit of a transport systems. An optical/electrical (O/E) converter 701 provided in the interface circuit 700 converts an optical signal to be transmitted into an electrical signal, and outputs data and a clock. A serial-to-parallel (SP) processing unit 702 performs serial-to-parallel conversion of the data and the clock, and outputs parallel data and clock to a termination unit 703. The termination unit 703 detects a line error and switches a working line to a protection line or notifies an occurrence of a line error to outside based on the line error detected so as to repair a line failure. When a problem of degradation of amplitude of the clock occurs, error notification and line switching for reducing line damages can be carried out in this manner. One of the popular techniques to detect the error in a signal to be transmitted is to perform a parity check of a bit error (for example, see Japanese Patent Application Laid-open No. S52-9335).

FIG. 8 is a block diagram of a conventional termination unit. The termination unit 703 is provided with a signal failure detecting unit 801 that detects a line failure, a signal degradation detecting unit 802, an OR circuit 803, and an ACT (Activation)/DEACT (Deactivation) processing unit 804. The signal failure detecting unit 801 detects loss of signal (LOS), loss of frame (LOF), alarm indication signal-Line (AIS-L), and B2-Major (B2-MJ). The signal degradation detecting unit 802 detects B2-Minor (B2-MIN).

Detection signals from the signal failure detecting unit 801 and signal degradation detecting unit 802 are output to the ACT/DEACT processing unit 804 via the OR circuit 803. The ACT/DEACT processing unit 804 outputs a processing signal indicating a line failure after a predetermined guard time measured by an internal timer has elapsed since inputting of the detection signals. A notification of a line failure and a request for line switching are output as the processing signal. Based on the request for the line switching, a switching from the working line to the protection line is performed.

However, a generation of a burst error in the transport systems is assumed on application of surge or burst electrostatic discharge (ESD), such as lightening, and a line error that occurs at the time of line switching caused by a failure in machine. In general, the transport systems is supposed to suppress an unnecessary line switching of a normal portion when the burst error occurs.

Therefore, even if the burst error is generated based on a line failure originated from a failure in the conventional transport systems, it is not possible to notify the occurrence of the burst error or switch the working line where a burst error has occurred to the protection line.

Although the degradation of the clock that is cause of the burst error can also be considered as a sign of a bit error, it is generally detected as out of frame (OOF) based on a change in the clock count number of an internal circuit (logic circuit) that constitutes the SP processing unit 702.

FIG. 9A and FIG. 9B are schematic diagrams for illustrating a generation of the burst error: FIG. 9A depicts a case of clock degradation; and FIG. 9B depicts a case of data degradation. In a normal mode, a position f of the data always coincides with a position of the clock count. When the clock is degraded, however, one clock is dropped out, and the frame top position f of the data is shifted from the position of the clock count. This is the state of OOF. When the OOF occurs, the internal circuit of the SP processing unit 702 performs resynchronization but the data over the period up to the resynchronization keeps generating data errors, leading to a state where a burst error occurs. According to a specification of the SONET, OOF, it is regulated to perform the line switching as LOF when the OOF is sustained for 3 milliseconds; however, the OOF alone does not bring about the line switching.

FIG. 10 is a schematic diagram for illustrating the STS-N frame format. The OOF is defined as being out of synchronization over five consecutive frames (125×5=625 microseconds). Accordingly, the number of error bits caused by the burst error can be defined as 32,400×N bits for the STS-N (N=1, 3, 12, 48, 192) frame. Note that 32,400 bits=90 bytes×9 bytes×8 bits×5 frames.

FIG. 11 is a graph of a burst error rate characteristic for STS-48 (N=48). The horizontal axis in the diagram represents an interval (minute) of occurrence of the burst errors and the vertical axis represents an error rate. Even when one burst error occurs every ten minutes, the burst error occurs at a considerably high error rate of 8.3E-03, and thus it cannot be neglected. Generally, the error rate of 1.00E-03 is used as a set value for B2-MJ and the error rate of 1.00E-06 is used as a set value for B2-MIN.

Data is identified by a difference from a reference value. At this time, when a noise component is superposed to a reference value R and the level of the identification value becomes about the same level as the reference value R (corresponding to 1, 2, and 3 in the diagram), the noise frequency generated then may lead to erroneous detection of the identification values 1, 2, and 3 all being "0", resulting in a burst error. As described above, conventionally, the burst error that is generated discretely due to the line failure or the machine failure cannot be detected as a burst error.

The line error is monitored normally by comparing a result of vertical computation of data after descrambling all bits of the STS-N frame (frame 1) excluding three rows of the unit overhead (SOH) (the shaded range in FIG. 10A) with B2 of the next frame (Frame 2) after descrambling. Specifically, the method called Bit Interleaved Parity N×8 (BIP-N×8) divides entire information to be subjected to error monitoring into groups of N×8 bits and monitors an error group by group. In the comparison of the count result with an even parity, it is possible to detect 0 (no error) with even number of 1's, and 1 (error occurred) with odd number of 1's. Note that the number of bits of B2 increases as 8 bits for STS-1 and 8×3=24 bits for STS-3.

In the example of STS-48, the total number of bits in one frame (125 microseconds) becomes 9 bytes×90 bytes×48 (equivalent to N)×8 bits=311,040 bits. Even when noise is superposed to the reference value R and a data identification error occurs in one frame, causing the burst error, it is not possible to detect more than 384 bits (N=48×8 bits) at a maximum with the parity error of B2 alone.

FIG. 12 is a graph for illustrating a parity saturation characteristic when monitoring B2 parity. The horizontal axis represents the bit error rate and the vertical axis represents probability of occurrence of parity errors. From the diagram, the B2 parity saturation characteristic is 0.5 (when the bit error rate is 1.28E-03 or greater). This means that the B2 parity error detectable is merely about 192 bits, half the maximum of 384 bits. Because such parity monitoring (even parities) makes an error of two bits or more appear just as a 1-bit error or 0-bit error, it is possible that even when the count value of B2 is "0", the burst error occurs.

FIG. 13 is a table of a list of detection conditions for a B2 error in the STS-48. The bit error monitoring can detect the bit error as a random error that can be detected under any one of the normal error monitoring conditions as given in the B2 error detection conditions in the diagram. However, the clock degradation and bit error (burst error) originated from the data identification error could not be detected as the random error because of the large number of errors (the saturation region of the B2 parity) and discontinuity.

The burst error that occurs due to the line failure should be considered as a decision condition under which the occurrence of a line failure is to be detected because of considerable number of errors. However, the conventional technology has a difficulty in detecting discrete burst errors and cannot include the burst error in the conditions for determining a line failure, and currently there is no effective way to monitor the occurrence of the data identification error and the burst error originated from clock degradation.

SUMMARY OF THE INVENTION

It is an object of the present invention to solve at least the problems in the conventional technology.

The transport systems according to one aspect of the present invention includes a burst error detecting unit that monitors a predetermined byte specified in advance in a frame to be monitored in a transmission signal having header information and data information multiplexed into the frame in bytes, detects a burst error based on a change in a state of occurrence of a bit error in the predetermined byte in a predetermined time window, and outputs a burst error detection signal upon detection of the burst error.

The method of monitoring a burst error, according to another aspect of the present invention includes detecting a bit error in a predetermined byte specified in advance in a frame to be monitored in a transmission signal having header information and data information multiplexed into the frame in bytes, detecting the burst error based on a change in a state of occurrence of a bit error in the predetermined byte in a predetermined time window, and outputting a burst error detection signal upon detection of the burst error.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 8 is a block diagram of a conventional termination unit;

FIG. 13 is a table of a list of detection conditions for a B2 error in the STS-48.

DETAILED DESCRIPTION

Exemplary embodiments of a transport systems and a method of monitoring burst error, according to the present invention will be described in detail with reference to the accompanying drawings.

Taking the STS-48 frame format as an example, conditions for detecting a burst error are described first, based on the example of the B2 error detecting conditions (see FIG. 13). B2 error detection requires that the number of errors in a frame to be monitored should satisfy a predetermined quantity. In a state where a burst error occurs, a parity error detecting circuit that detects a B2 error seems to be saturated. To detect 204 or more errors, therefore, a burst error occurrence time of two frames (125 microseconds×2) at a minimum is needed as illustrated.

When one burst error occurs every ten minutes, as illustrated, the detection time becomes 7.875 seconds or shorter for the error rate set to 1.0E-07 or greater, so that the error cannot be detected. If the detection condition is the error rate set to 1.0E-08 or greater, however, normal error detection is possible. Based on the relationship between the occurrence interval of burst errors and the B2 error detection time that has been used conventionally, therefore, a burst error detecting unit (whose details will be given later) according to the present invention can detect burst errors when the error rate is set to 1.0E-08 and 1.0E-09.

When the error rate for the threshold level for error detection is set to 1.0E-08, for example, the number of errors detected by the burst error detecting unit per second (=1 second (8000 frames) performance monitor (PM) count) is 18. In consideration of the property that odd parity errors occur in monitored bits, however, there is a possibility that a maximum of 378 bits (18×a maximum odd number of 21) in 384 bits. Because the burst error should not necessarily occur in the PM count period (e.g., one second), the burst error can be detected if the accumulated error count values in successive two PM count periods is equal to or more than 20 bits (2×10 bits).

Figure 1:
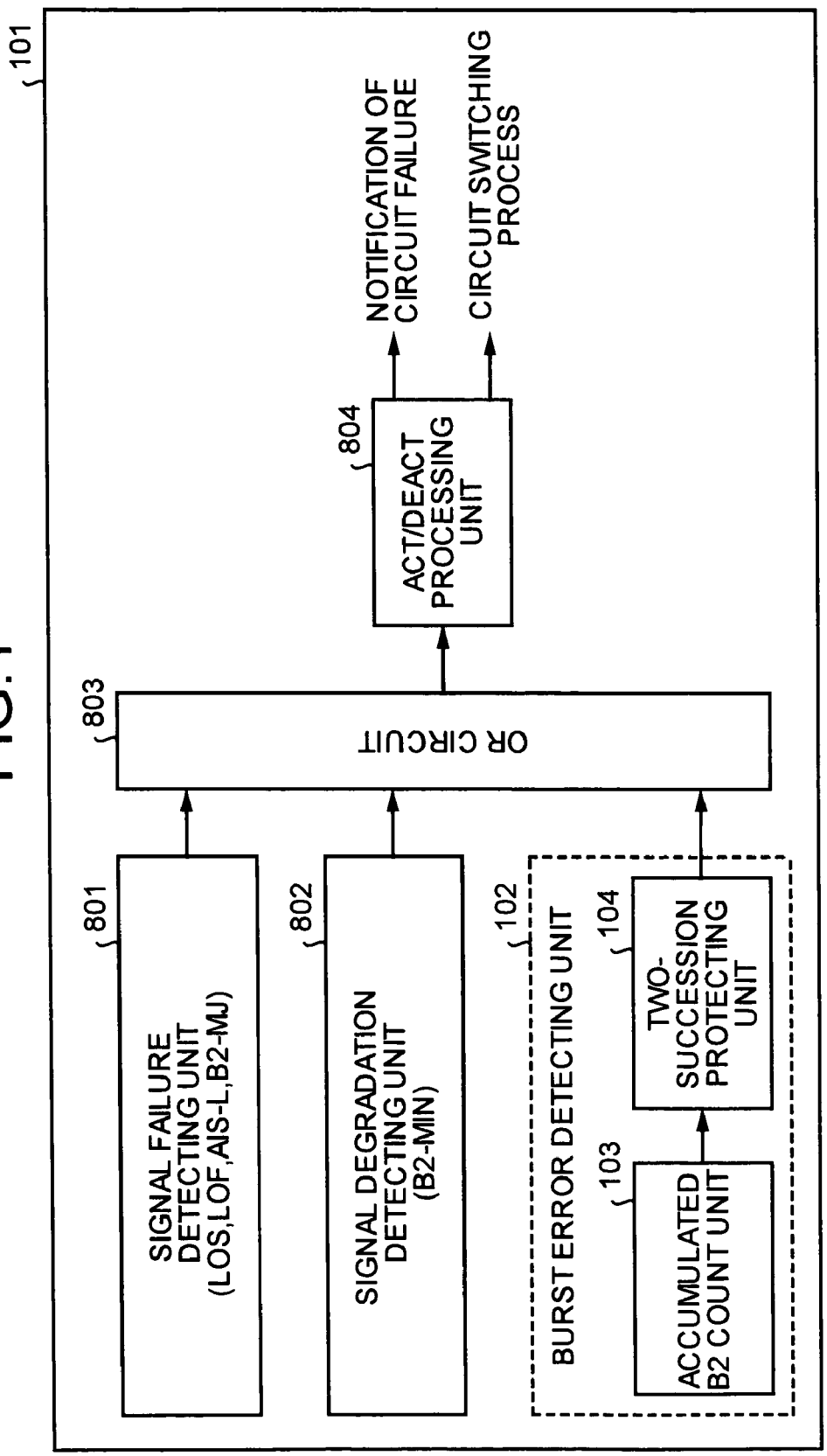
FIG. 1 is a block diagram of a SONET transport systems according to a first embodiment of the present invention.

FIG. 1 is a block diagram of a SONET transport systems according to a first embodiment of the present invention. A termination unit 101 is provided with a signal failure detecting unit 801 concerning the signal circuit, a signal degradation detecting unit 802, a burst error detecting unit 102, an OR circuit 803, and an ACT/DEACT processing unit 804.

The signal failure detecting unit 801 detects LOS, LOF, AIS-L, and B2-MJ. The signal degradation detecting unit 802 detects B2-MIN. Those signal failure detecting unit 801 and signal degradation detecting unit 802 are constituted by a logic circuit (hardware). It is to be noted that the 1 second PM count itself executes software-based polling.

The burst error detecting unit 102 has an accumulated B2 count unit 103 and a two-succession protecting unit 104. The burst error detecting unit 102 is composed of software that detects a burst error and executes a burst error detecting process.

Detection signals respectively detected by the signal failure detecting unit 801, the signal degradation detecting unit 802 and the burst error detecting unit 102 are output to the ACT/DEACT processing unit 804 via the OR circuit 803. The ACT/DEACT processing unit 804 outputs a processing signal at the time of a line failure based on the detection signals. As the processing signal, notification of a line failure and a request for line switching are output. Based on the request for line switching, line switching from a working line to a protection line is performed.

The accumulated B2 count unit 103 in the burst error detecting unit 102 sets the burst-error hunting cycle of 10 seconds based on 1-second PM count period of the B2 error. When there is only detection of an accumulated value of 20 bits or more of two successive 1-second PM counts during the burst-error hunting cycle, it is detected as a burst error.

The accumulated B2 count unit 103 provides a plurality of setting conditions as accumulation conditions for the PM count and sets threshold levels for up counting in the individual setting conditions to distinguish them over the B2 error detection conditions in the conventional error rate setting. First, as illustrated in FIG. 13, for the error rate set to 1.0E-08, 18 bits are countable per 1-second PM count, so that an error of up to 18 bits is considered as a normal error and only when the error count consists of 19 bits or more, the accumulated B2 count value as a case of a burst error is incremented. For the error rate set to 1.0E-09, 2 bits are countable per 1-second PM count, so that the accumulated B2 count value as a case of a burst error is incremented only if it consists of 3 bits or more.

The following describes the operation of the accumulated B2 count unit 103 when the error rate is set to 1.0E-09.

(1) When there are two or more detections of an accumulated value of 20 bits or more of two successive 1-second PM counts in the burst-error hunting cycle, the error is processed as a normal random error and re-hunting is initiated.

To distinguish an accidental burst error originated from the application of a surge or burst ESD, such as lightening, and a burst error discretely generated due to the degradation of the amplitude of the clock in the interface circuit, the following processes (2)-(5) are executed.

(2) In case of a single detection of the burst error, it may be an accidental burst error so that a detection signal of the burst error is output only when the burst error is detected again after a predetermined guard time has passed. This guard time can be set to an arbitrary time by a user. The predetermined time can be set to an arbitrary value every ten minutes within the range from 10 minutes to 60 minutes based on the property of the burst error and the saturation characteristic of the B2 parity.

Figure 11:
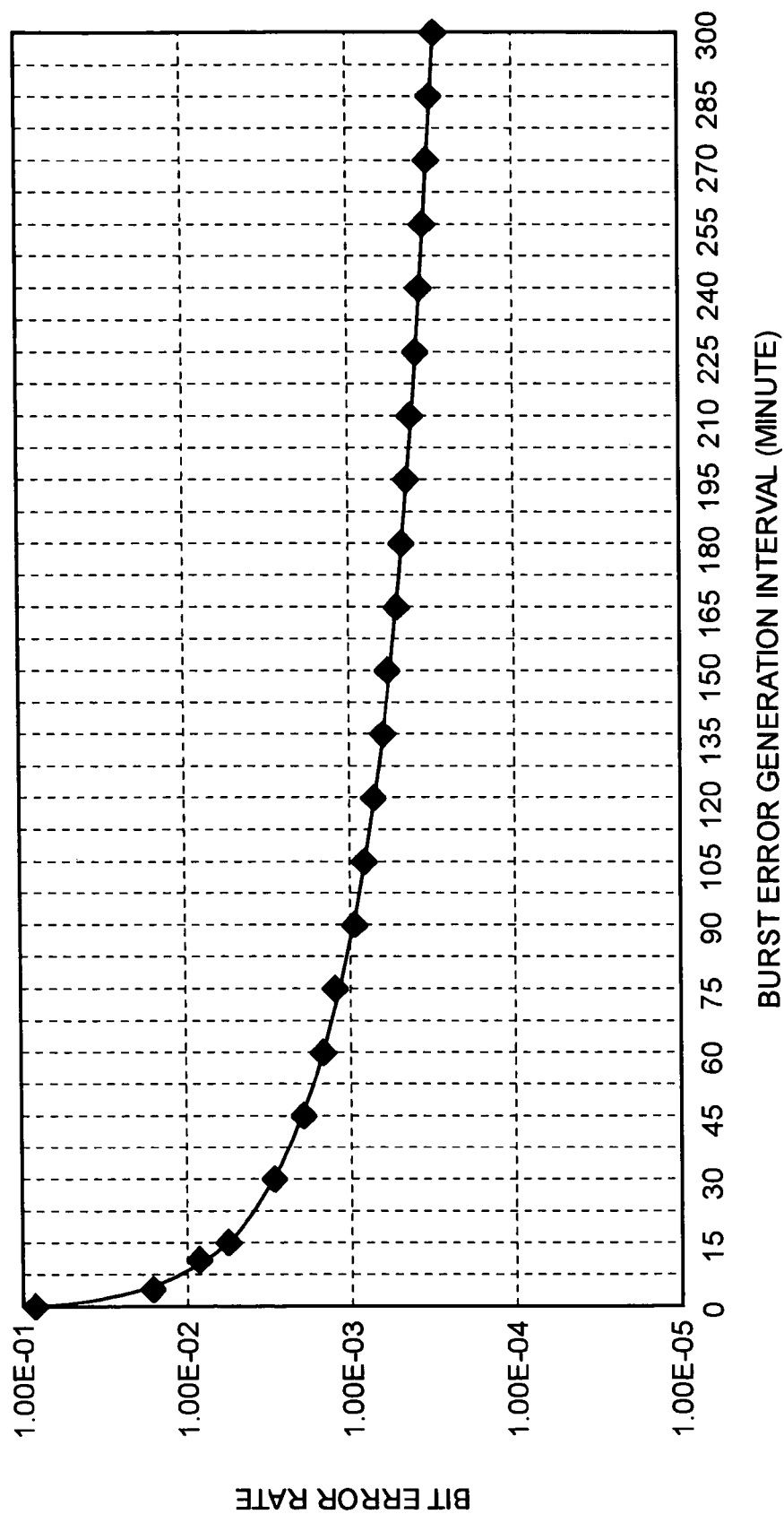
FIG. 11 is a graph of a burst error rate characteristic for STS-48 (N=48)
Figure 12:
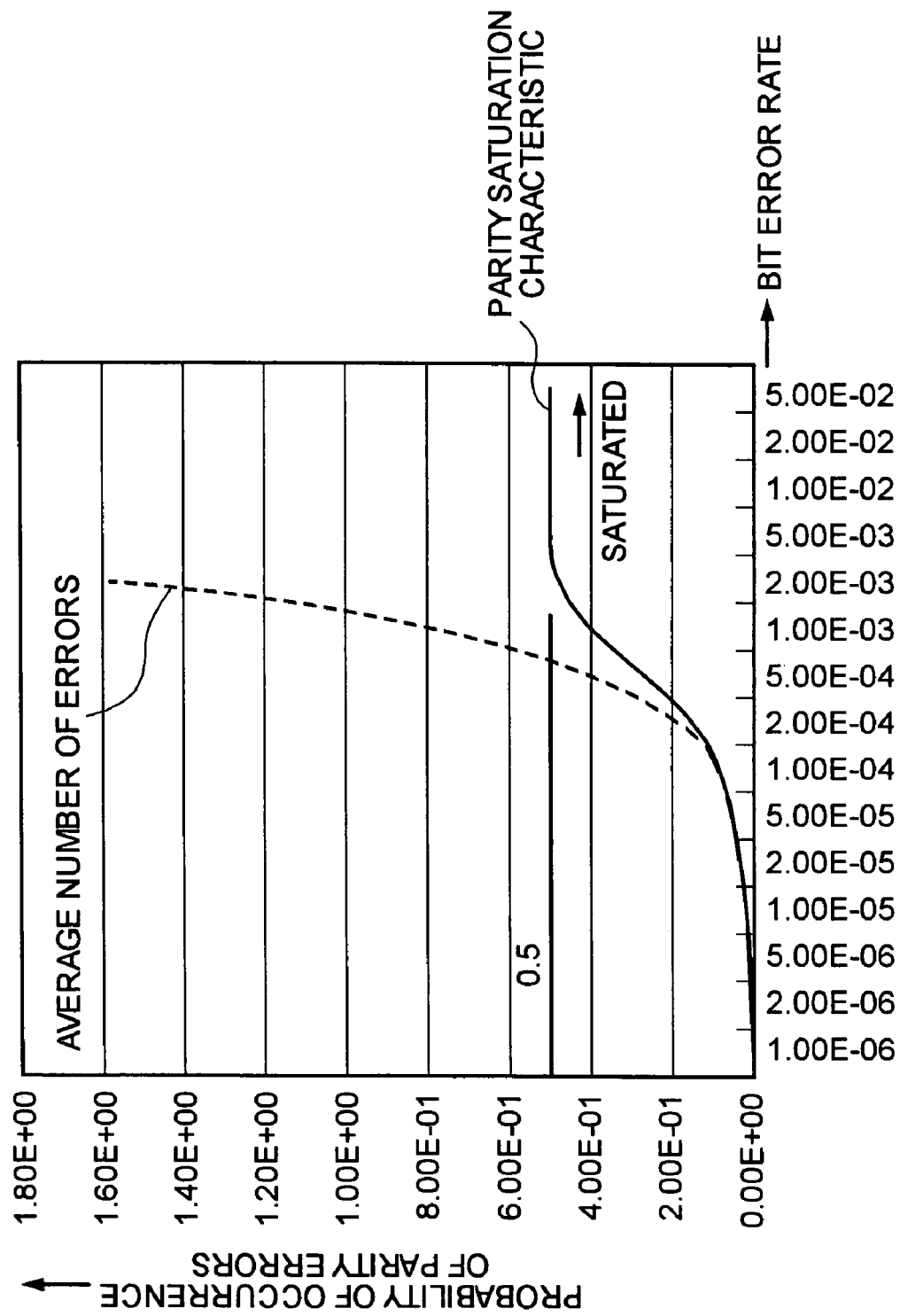
FIG. 12 is a graph for illustrating a parity saturation characteristic when monitoring B2 parity.

From the saturation characteristic of the parity illustrated in FIG. 12, for example, saturation occurs when the error rate is near 2.00E-03 so that the guard time is set for the target of the generation interval of burst errors lying within 60 minutes in FIG. 11. Even when one burst error occurs every ten minutes, errors occur at a considerably high error rate of 8.3E-03, so that it is adequate to set the guard time within the above range. Such setting of the guard time can distinguish a normal error from a burst error.

(3) As the guard time is set, the burst error, if detected even once during the guard time, is processed as a normal random error and re-hunting is initiated.

(4) When a burst error is detected in both of the working line and the protection line with a difference of a short time (e.g., ±1 second) in the burst-error hunting cycle of 10 seconds, it is determined as an accidental burst error originated from the ESD and the re-hunting is initiated.

(5) For a protective purpose, the burst error detection signal detected under the conditions is cleared when a state of detecting no burst error after the guard time successively occurs by a predetermined number of times (e.g., two times) in the later re-hunting. The protection is taken to adequately determine clearing after the burst error has occurred based on a line failure.

Through the processes (1)-(5), the burst error can be detected and the acquired detection signal is added as a condition for determining a line failure. This can ensure error notification of the line failure and the line switching both originated from the burst error.

Figure 2:
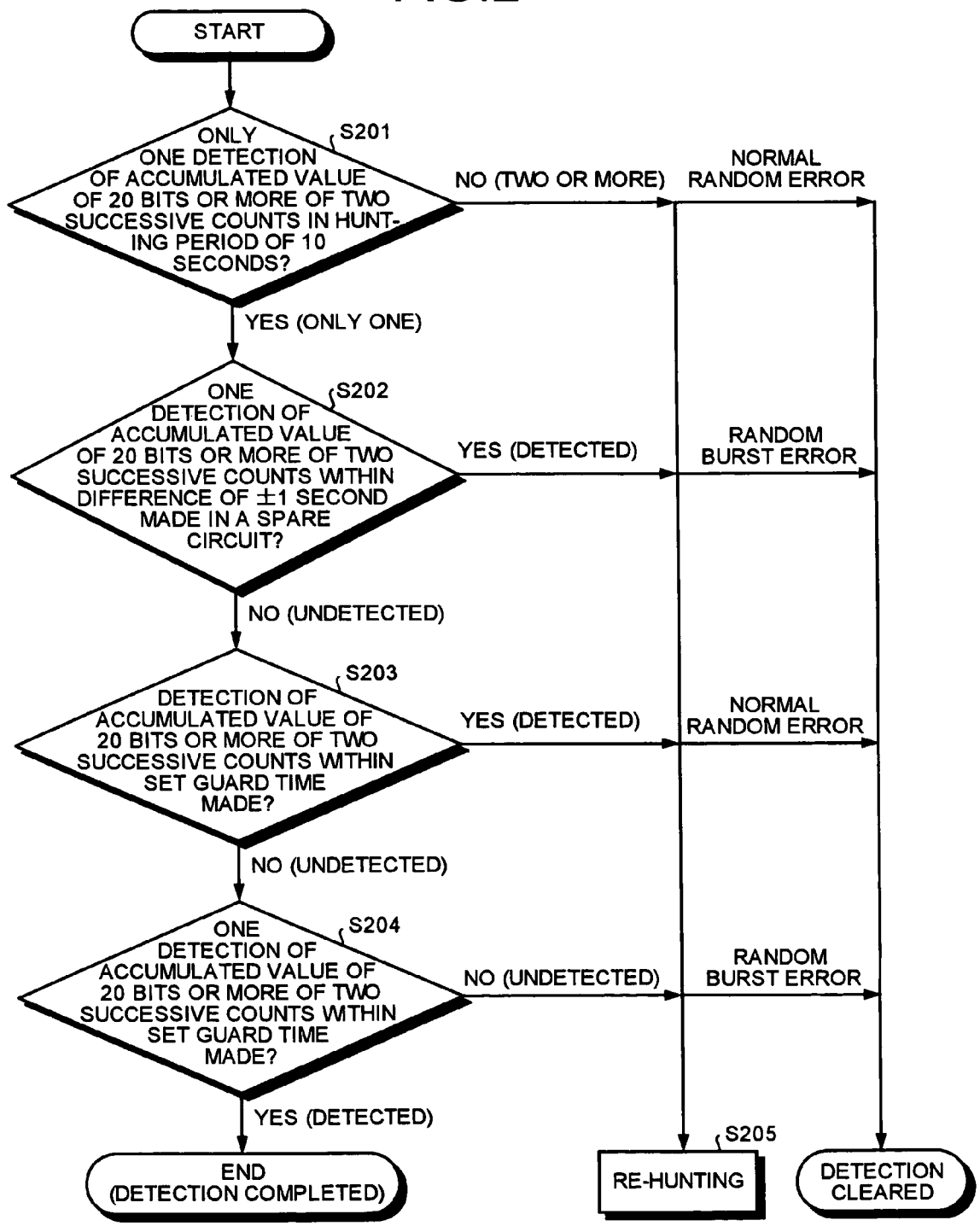
FIG. 2 is a flowchart of a burst error detecting process performed by a burst error detecting unit.

FIG. 2 is a flowchart of a burst error detecting process performed by the burst error detecting unit 102. While FIG. 2 mainly depicts a process of detecting a burst error with respect to a working line, the same process can be executed for a protection line too in parallel.

When initiating detection of a burst error, the burst error detecting unit 102 detects the burst error when detecting one count of an accumulated value of 20 bits or more of two successive B2 PMs. First, it is determined whether there is only one detection of the accumulated value of 20 bits or more of two successive counts in hunting cycle of 10 seconds (step S201). In case of only one count (Yes in step S201), it is determined to be an initial detection state of the first burst error and the flow goes to step S202.

In step S202, it is determined whether one detection of the accumulated value of 20 bits or more of two successive counts within a difference of ±1 second in a protection line is made. When there is no detection (No in step S202), the flow goes to step S203.

It is determined in step S203 whether detection of the accumulated value of 20 bits or more of two successive counts within the guard time is made. When there is no detection (No in step S203), the flow goes to step S204.

It is determined in step S204 whether one detection of the accumulated value of 20 bits or more of two successive counts after the guard time is made. When there is a detection found (Yes in step S204), all the conditions in the steps S201 to S204 are satisfied, the set conditions are met, and the detection signal of the burst error is output to the outside for the first time, considering that detection of the occurrence of the burst error has been completed.

When none of the conditions are met, therefore, re-hunting (step S205) is executed. When there are two or more detections of the accumulated value of 20 bits or more of two successive counts in hunting cycle of 10 seconds in step S201 (No in step S201), for example, the error is considered as a normal random error, the current burst error detection state is cleared and re-hunting is executed. In re-hunting mode, the accumulated B2 count unit 103 clears the accumulated B2 count that has been counted so far (e.g., count value=0).

When one detection of the accumulated value of 20 bits or more of two successive counts within a difference of ±1 second in a protection line is made in step S202 (Yes in step S202), the error is considered as an accidental burst error, the current burst error detection state is cleared and re-hunting is executed. Likewise, when detection of the accumulated value of 20 bits or more of two successive counts within the guard time is made in step S203 (Yes in step S203), the error is considered as the normal random error, the current burst error detection state is cleared and re-hunting is executed.

When no detection of the accumulated value of 20 bits or more of two successive counts after the guard time is made in step S204 (No in step S204), the error is considered as the accidental burst error, the current burst error detection state is cleared and re-hunting is executed.

Figure 3:
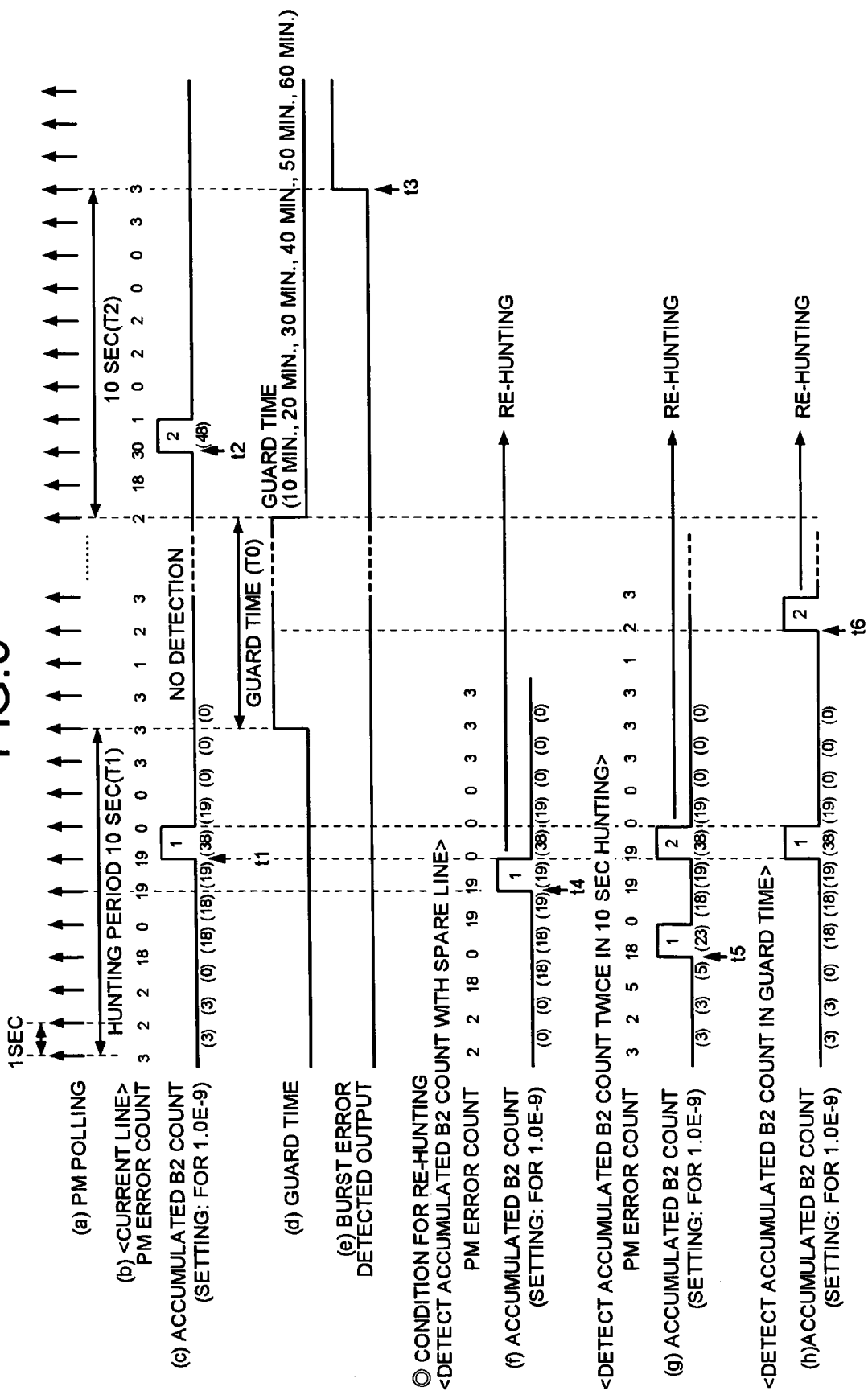
FIG. 3 is a timing chart for illustrating detection of a burst error.

The following specifically describes the burst error detecting process according to the setting of the conditions. FIG. 3 is a timing chart for illustrating detection of the burst error. In this diagram, the error rate is set to 1.0E-09. (a) illustrates a 1-second PM count period and a window of a burst-error hunting cycle (T1) of 10 seconds is set. As shown in (b), the accumulated B2 count unit 103 performs a PM error count for the working line every 1-second PM count period.

Then, the accumulated B2 count unit 103 increments the accumulated B2 count only when the error count per 1-second PM count consists of 3 bits or more, as shown in (c). Given that for the PM error count (bit), the first second is 3, the second is 2 and the third second is 2, for example, the accumulated B2 count value is 3 bits for the first second and 2 bits for the second, does not count up and stays as 3, and the third second is also 2 bits, so that the count is cleared to be 0. As the PM error count is 19 and 19 twice consecutively for the sixth second and the seventh second, the accumulated B2 count value for the seventh second becomes 19+19=38 which exceeds 20 (bits). At this timing (t1), the accumulated B2 count unit 103 outputs data "1" of the accumulated B2 count value to the two-succession protecting unit 104. In this state, the two-succession protecting unit 104 increments the count value to 1 from 0.

Thereafter, after the guard time (T0) of 10 minutes illustrated in (d) passes, there is one detection that the 1-second PM count accumulated value of 20 bits or more occurs once (time t2). The accumulated B2 count value at this time becomes 18+30=48 which exceeds 20 (bits). At this timing (t2), the accumulated B2 count unit 103 outputs data "1" of the accumulated B2 count to the two-succession protecting unit 104. In this state, the two-succession protecting unit 104 increments the count value to 2 from 1.

Accordingly, the count value becomes "2" and the two-succession protecting unit 104 outputs the burst error detection signal outside. The timing illustrated in (e) at which the burst error is output outside comes when the second burst-error hunting cycle (T2) of 10 seconds ends (time t3) and the burst error is kept output after time t3.

The conditions for re-hunting are described next. When each of conditions of (f) to (h) is met, the error is not determined as a burst error and the two-succession protecting unit 104 clears the accumulated B2 count and executes re-hunting.

(f) illustrates a state where the time (t1) at which a burst error in a working line is detected and the time (t4) at which a burst error in a protection line is detected, both in one burst-error hunting cycle (T1), occur with a short time difference (±1 second in the illustrated example). In such a case, the error is determined as a burst error which occurs accidentally in the working line and the protection line at a time by the ESD, such as lightening. Then, the two-succession protecting unit 104 clears the accumulated B2 count and starts re-hunting.

(g) is a timing chart for describing the setting condition (1) illustrating a state where detection of the accumulated value of 20 bits or more of two successive 1-second PM counts has been made twice in one hunting cycle (T1) (twice at the time (t5) and the time (t1). In such a case, the error is determined as the normal random error. Then, the two-succession protecting unit 104 clears the accumulated B2 count and starts re-hunting.

(h) is a timing chart for describing the setting condition (3). When detection of the accumulated value of 20 bits or more of two successive 1-second PM counts is made once in one hunting cycle (T1) (time t1), the two-succession protecting unit 104 increments the accumulated B2 count to "1". (h) illustrates a case of a burst error being detected thereafter (time t6) during the guard time (T0). When a burst error is detected during the guard time (T0) after a burst error has been detected once, the burst error occurred in the guard time is determined as a normal random error. The two-succession protecting unit 104 clears the accumulated B2 count and starts re-hunting.

Figure 4:
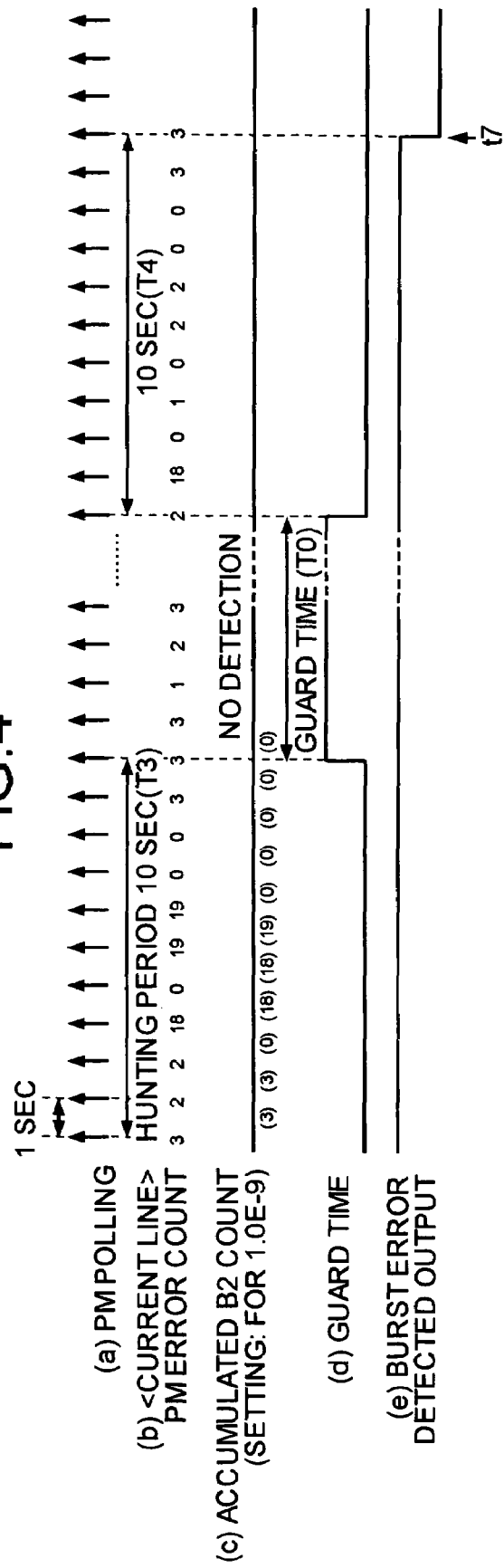
FIG. 4 is a timing chart for illustrating a release of the burst error detection.

FIG. 4 is a timing chart for illustrating a release of the burst error detection. At a time after the burst error detection signal is output, the output of the detection signal is cleared when the state where a burst error after the guard time is not detected in re-hunting occurs successively by a predetermined number of times (e.g., twice). The illustrated example shows the case that there is not detection of the accumulated value of 20 bits or more of two successive 1-second PM counts occurred during the first re-hunting (period T3), the guard time (T0) and the second re-hunting (period T4). In such a case, the two-succession protecting unit 104 clears the output of the burst error detection signal when the time of the second re-hunting (period T4) passes (time t7).

As described above, the first embodiment can detect a burst error which is generated discretely due to a line failure or a failure or the like in a machine having optical parts and electronic circuits. Accordingly, a burst error of several ten thousand bits can be distinguished over the normal bit error and detected once every several minutes, and notification of a line error and line switching can be done when the burst error occurs. In addition, such a burst error can be detected easily in the software-based process using the existing parity detecting method.

While the first embodiment performs error monitoring using the B2 byte for detecting a line failure (circuit problem), a second embodiment of the present invention detects a burst error using the B3 byte for notifying an error in a path and path switching.

Figure 5:
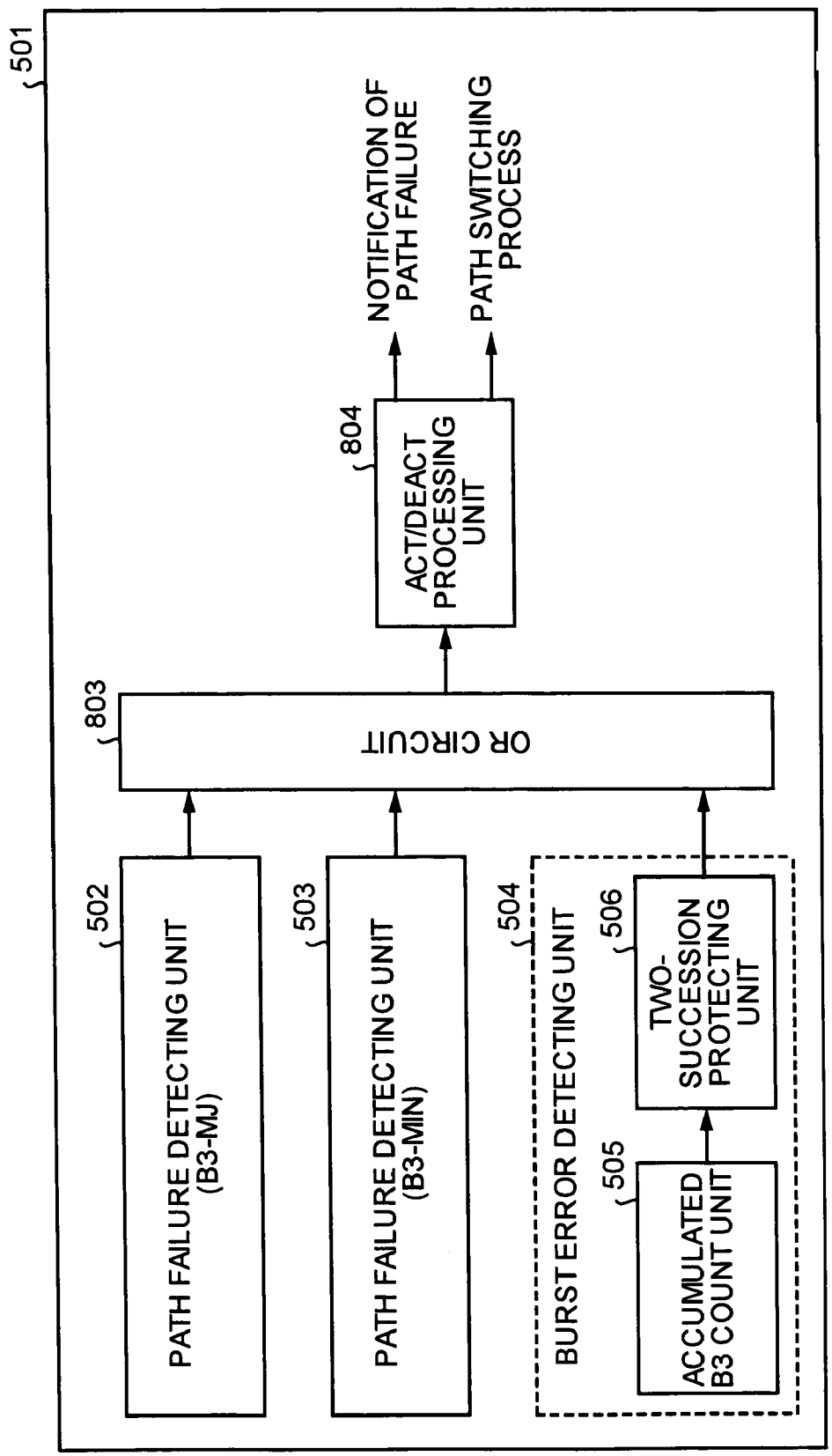
FIG. 5 is a block diagram of a SONET transport systems according to a second embodiment of the present invention.

FIG. 5 is a block diagram of a SONET transport systems according to a second embodiment of the present invention. A termination unit 501 is provided with two path failure detecting units 502 and 503 which have conventionally been used to detect a path failure. The path failure detecting unit 502 is for B3-MJ and the path failure detecting unit 503 is for B3-MIN. In addition, a burst error detecting unit 504 which detects a burst error using the B3 byte is provided in this embodiment. The burst error detecting unit 504 has an accumulated B3 count unit 505 and a two-succession protecting unit 506. Their structures differ from those of the first embodiment in that monitoring of the B2 bit described in the foregoing description of the first embodiment is applied to the B3 byte, but the fundamental monitoring operation is the same. Further, the OR circuit 803 and the ACT/DEACT processing unit 804 have the same structures as those of the first embodiment.

The burst error detecting unit 504 has an accumulated B3 count unit 505 and a two-succession protecting unit 506. The burst error detecting unit 504 detects a burst error using the B3 byte for path switching instead of monitoring the B2 byte as described in the foregoing description of the first embodiment. A process of detecting a burst error can be performed similarly even using the parity error detecting conditions with the B3 byte that is used for notification of a path error and path switching.

Figure 6A:
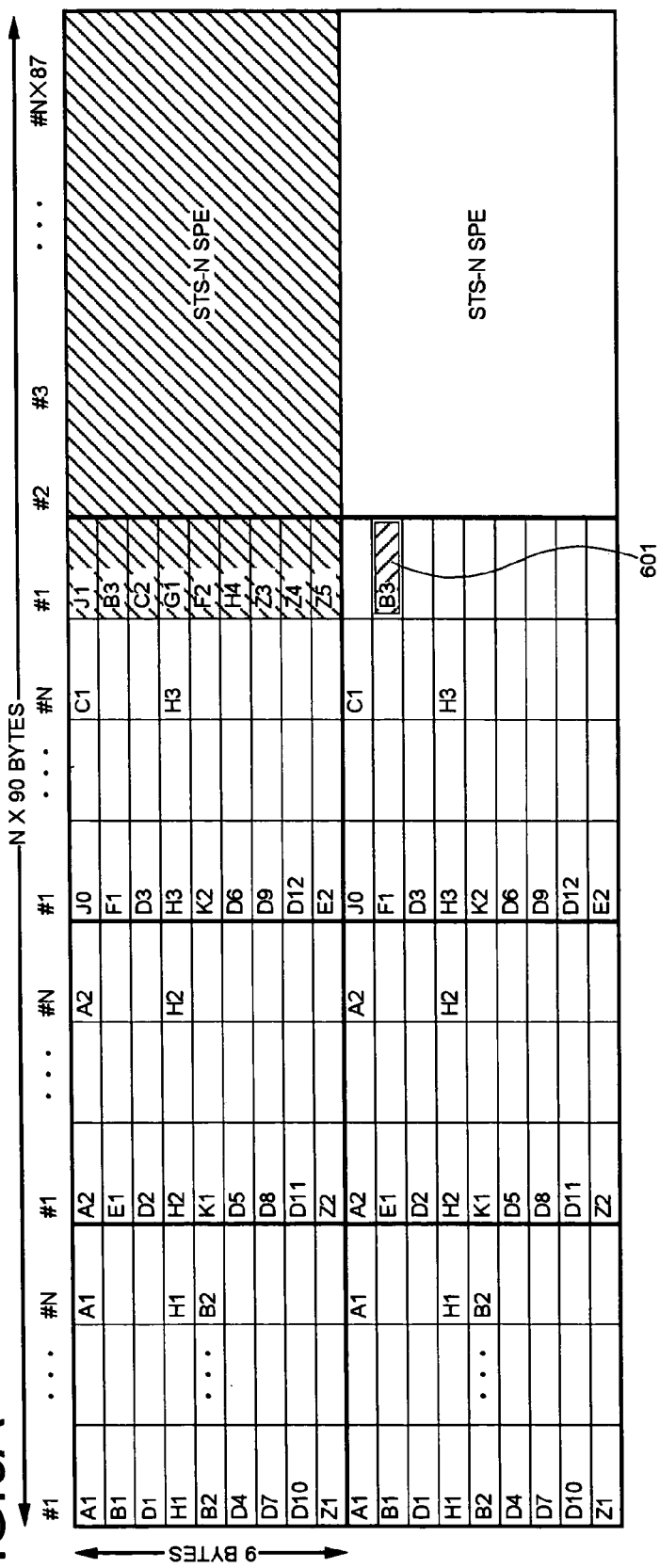
FIG. 6A and FIG. 6B are schematic diagrams for illustrating B3 byte in STS-N frame format.
Figure 6B:
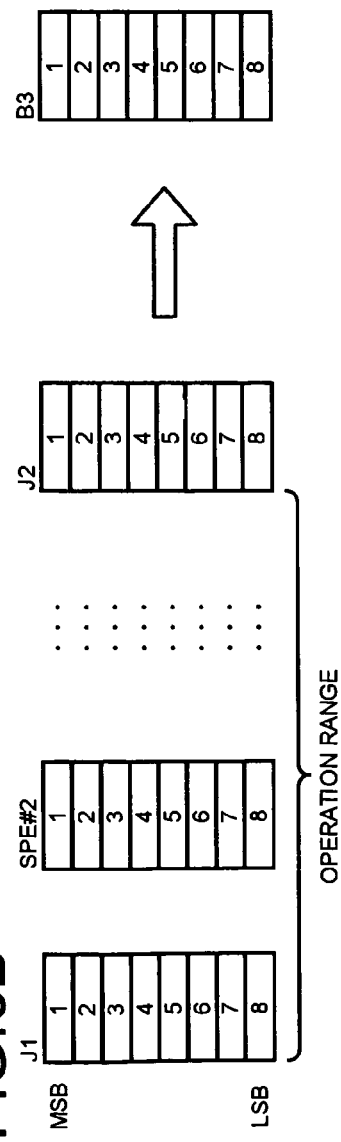
Figure 7:
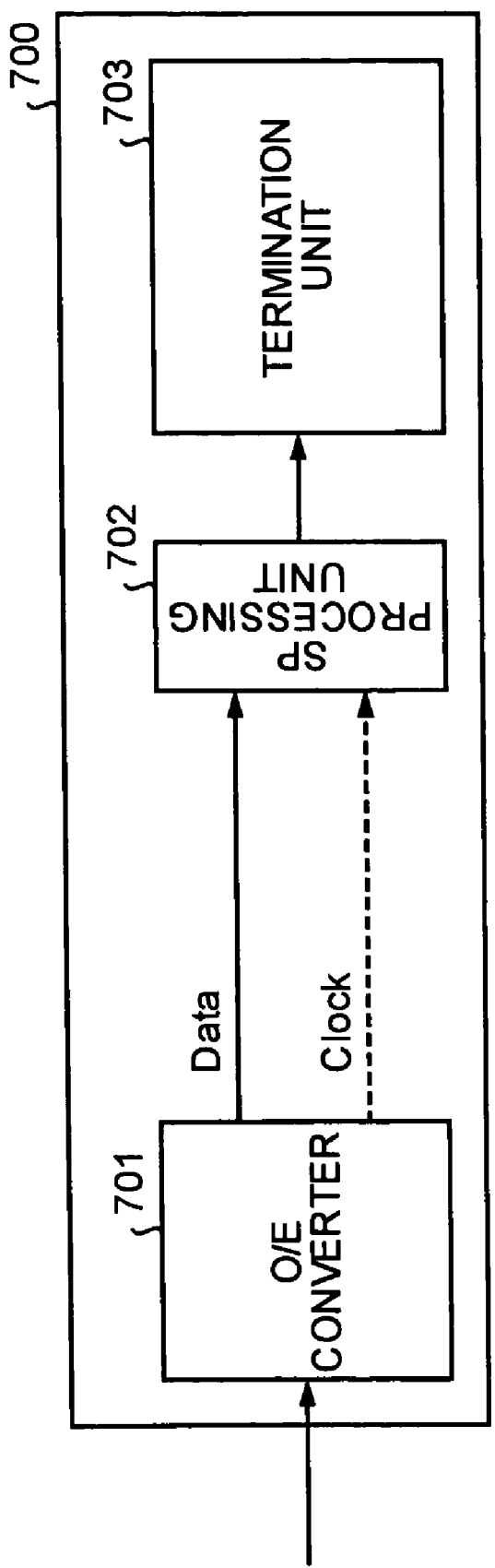
FIG. 7 is a block diagram of an interface circuit of the transport systems.
Figure 9A:
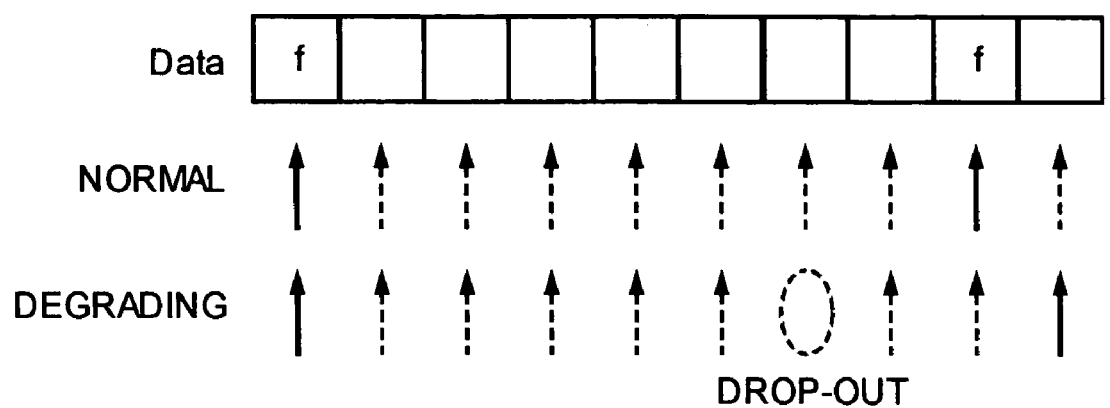
FIG. 9A and FIG. 9B are schematic diagrams for illustrating a generation of the burst error.
Figure 9B:
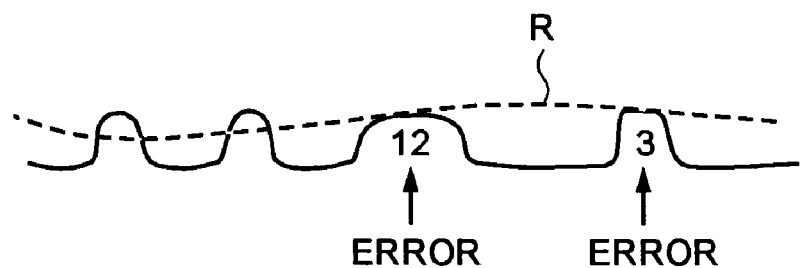
Figures 10A, 10B:
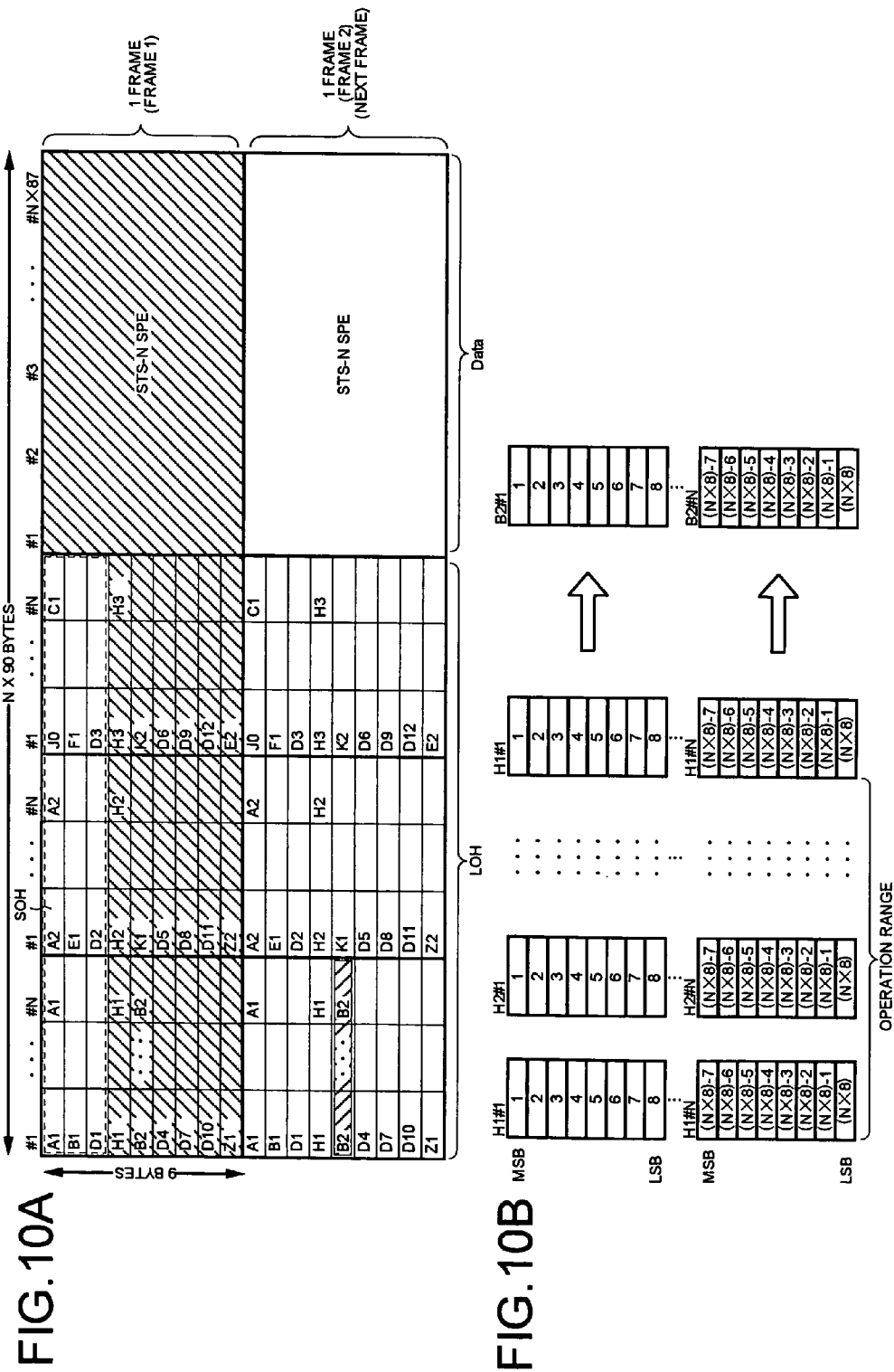
FIG. 10A and FIG. 10B are schematic diagrams for illustrating the STS-N frame format.

FIG. 6A and FIG. 6B are schematic diagrams for illustrating B3 byte in STS-N frame format. A normal path error monitoring is executed by comparing the result of computation (hatched portion in FIG. 6A) of all the bits excluding the transport overhead (TOH) of the STS-N frame with the B3 byte 601 of the next frame. This comparison is . called BIP×8 (Bit Interleaved Parity 8) and divides entire information to be subjected to error monitoring into groups of 8 bits and monitors an error group by group. In the example of STS-48c, the total number of bits in one frame (125 microseconds) becomes 9×87×48×8=300,672 bits. When noise enters the reference value and a data identification error occurs in one frame, causing a burst error, only a maximum of 8 bits can be detected with a B3 parity error.

According to the second embodiment, the two path failure detecting units 502 and 503 detect parity errors based on B3-MJ and B3-MIN using 1-second PM with respect to the existing B3 error, as in the case of using the B2 byte which has been described in the foregoing description of the first embodiment. The second embodiment is designed in such a way that the burst error detecting unit 504 newly added monitors the B3 byte. This can ensure notification of a path error and path switching even when a burst error is produced by a machine failure or the like in that portion where the path is terminated.

The foregoing descriptions of the first and the second embodiments have been given of an example of N=48 in the STS-N frame format. The present invention is not limited to this case but the error rate can be applied to all the ranges of various rates N(OC)=1, 3, 12, 48, 192, and so forth as defined in the SONET and a burst error can be detected at any rate with the structure. The present invention can also be adapted to SONET/SDH (Synchronous Digital Hierarchy).

Although a burst error can be detected by the burst error detecting unit 102 in the first embodiment, the structure of a burst error detecting unit (not shown) which uses the OOF may be added to the termination unit 101. Note that the burst error detecting unit 102 can detect the occurrence of a burst error without using the occurrence of OOF. The burst error detecting unit which uses OOF can detect the occurrence of a burst error based on OOF caused by clock degradation. As OOF does not occur in a data identification error, the burst error detecting unit which uses OOF cannot detect a burst error based on the data identification error. To detect a burst error based on the data identification error, therefore, the burst error detecting unit 102 described in the foregoing description of the first embodiment should be provided even when the burst error detecting unit which uses OOF is provided.

The method of monitoring a burst error which has been described in the foregoing description of the second embodiment can be realized by running software prepared beforehand.

The present invention can easily detect a burst error which is generated discretely due to a line failure or a machine failure or the like other than a burst error which is accidentally produced by the ESD, such as lightening, by using the result of existing parity detection. Accordingly, a burst error of several ten thousand bits can be detected once every several minutes, so that notification of a line error and line switching at the time a line failure or a machine failure occurs can be carried out.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A transport systems comprising:
a burst error detecting unit that monitors a predetermined byte specified in advance in a frame to be monitored in a transmission signal having header information and data information multiplexed into the frame in bytes, detects a burst error based on a change in a state of occurrence of a bit error in the predetermined byte in a predetermined time window, and outputs a burst error detection signal upon detection of the burst error
an accumulated count unit that counts number of parity error bits in the predetermined byte in a performance monitor period, and holds the number of parity error bits as an accumulated count value, wherein
the burst error detecting unit detects the bursts error when the accumulated count value is equal to or more than a predetermined value.

2. The transport systems according to claim 1, further comprising:
an output holding unit that holds output of the burst error detection signal until the burst error occurs plural times.

3. A method of monitoring a burst error, comprising:
detecting a bit error in a predetermined byte specified in advance in a frame to be monitored in a transmission signal having header information and data information multiplexed into the frame in bytes;
detecting the burst error based on a change in a state of occurrence of a bit error in the predetermined byte in a predetermined time window; and
outputting a burst error detection signal upon election of the burst error
counting number of parity error bits in the predetermined byte in a performance monitor period; and
holding the number of parity error bits as an a count value, wherein
the detecting the burst error includes detecting the burst error when the accumulated count value is equal to or more than a predetermined value.

4. The method according to claim 3, further comprising:
setting a bit error rate;
setting a threshold corresponding to number of bits that are error detectable with a normal parity check based on the bit error rate; wherein
the counting includes counting the number of parity error bits based on number of error bits that exceed the threshold.

5. The method according to claim 3, wherein the counting includes counting the number of parity error bits in the predetermined byte in a plurality of consecutive performance monitoring periods.

6. The method according to claim 3, further comprising:
setting a hunting cycle of a predetermined period based on the performance monitor period, wherein
the detecting the burst error includes detecting the burst error when the accumulated count value in the hunting cycle is equal to or more than the predetermined value.

7. The method accord to claim 6, further comprising;

clearing the accumulated count value when the burst error is detected more than one time within the hunting cycle; and resuming the counting in another hunting cycle.

8. The method according to 3, further comprising:

clearing the accumulated count value when the burst error is detected both in a working line and in a protection line within the performance monitoring period; and resuming the counting in another performance monitoring period.

9. The method according to claim 6, further comprising:

setting a guard time of a predetermined period based on a state of occurrence of the burst error between the hunting cycle and a next hunting cycle;

clearing the accumulated count value when, after the burst error is detected in the hunting cycle, another burst error is detected within the guard time; and resuming the counting in another hunting cycle.

10. The method according to claim 9, wherein the guard time is variably set based on a saturation characteristic of a bit error in the predetermined byte.

* * * * *